(12) United States Patent
Li (10) Patent No.: US 9,157,963 B2
(45) Date of Patent: Oct. 13, 2015

(54) METHOD AND SYSTEM FOR CALIBRATING BATTERY PACK VOLTAGE BASED ON COMMON-MODE CALIBRATION PARAMETER AND DIFFERENTIAL-MODE CALIBRATION PARAMETER

(75) Inventor: Guoxing Li, Sunnyvale, CA (US)

(73) Assignee: O2MICRO INC., Santa Clara, CA (US)

( * ) Notice: Subject to any disclaimer, the term of this patent is extended or adjusted under 35 U.S.C. 154(b) by 393 days.

(21) Appl. No.: 13/571,788

(22) Filed: Aug. 10, 2012

(65) Prior Publication Data

US 2014/0042995 A1  Feb. 13, 2014

(51) Int. Cl.
*G01N 27/416* (2006.01)
*G01R 31/36* (2006.01)

(52) U.S. Cl.
CPC .......... *G01R 31/362* (2013.01); *G01R 31/3658* (2013.01); *G01R 31/3651* (2013.01)

(58) Field of Classification Search
CPC ....................... G01N 27/4163; G01N 27/4175
USPC .................................................. 324/433, 434
See application file for complete search history.

(56) References Cited

U.S. PATENT DOCUMENTS

| 4,902,970 A * | 2/1990 | Suquet ........................... 324/173 |
| 5,914,606 A * | 6/1999 | Becker-Irvin .................. 324/434 |
| 6,236,215 B1 | 5/2001 | Kanehira |
| 2002/0180447 A1 * | 12/2002 | Masse et al. .................. 324/433 |
| 2013/0162259 A1 * | 6/2013 | Wynne .......................... 324/433 |

FOREIGN PATENT DOCUMENTS

CN     1229195 A     9/1999

* cited by examiner

*Primary Examiner* — Drew A Dunn
*Assistant Examiner* — Zixuan Zhou
(74) *Attorney, Agent, or Firm* — Pillsbury Winthrop Shaw Pittman, LLP (57) ABSTRACT

Method, system, and programs for calibrating battery pack voltage are disclosed. A negative terminal voltage of a cell is changed from a first to a second negative terminal voltage so that a cell voltage is changed from a first to a second output voltage. A positive terminal voltage of the cell is maintained at a substantially constant level. A differential-mode calibration parameter is calculated based on a difference between the first and second output voltages and a difference between the first and second negative terminal voltages. The negative terminal voltage of the cell is then changed from the first to second negative terminal voltage so that the positive terminal voltage of the cell is changed from a first to a second positive terminal voltage and the output voltage is changed from a third to a fourth output voltage. The cell voltage is maintained at a substantially constant value. A common-mode calibration parameter is calculated based on the differential-mode calibration parameter and a difference between the third and fourth output voltages and a difference between the first and second positive terminal voltages.

19 Claims, 5 Drawing Sheets

METHOD AND SYSTEM FOR CALIBRATING BATTERY PACK VOLTAGE BASED ON COMMON-MODE CALIBRATION PARAMETER AND DIFFERENTIAL-MODE CALIBRATION PARAMETER

BACKGROUND

1. Technical Field

The present disclosure relates generally to a method and system for calibrating the voltage of a battery pack.

2. Discussion of Technical Background

A battery pack usually includes a plurality of cells connected in series for supplying electric power to electronic equipment, such as an electronic vehicle, portable computer, electronic camera, or the like. The battery pack is usually equipped with a voltage detection apparatus that detects the voltage of each cell for capacity calculation and protection of each cell. The detected cell voltage level may be a floating voltage, which is measured by taking across the positive and negative terminals of each battery cell. In some cases, it may be desirable to translate the floating cell voltage to a ground referenced voltage so that a ground-based A/D converter (ADC) can be used to measure the translated voltage accurately.

One conventional approach to translating the floating cell voltage to a ground referenced voltage utilizes a differential operational amplifier with four externally coupled resistors. However, for battery packs having two or more battery cells connected in series, this conventional approach requires the use of a high voltage operational amplifier to accommodate the relatively large potential difference between the inputs of the operational amplifier. A high voltage operational amplifier may have a supply voltage between about 10 volts and 40 volts and may have a larger common-mode gain and offset voltage errors compared with a low voltage operational amplifier having a supply voltage less than or equal to about 5 volts. These errors may then need to be corrected by balancing all four resistor values in a complex calibration process that may require making fine adjustments to at least one of the four resistors. Otherwise, since the offset voltage errors are related to common-mode voltages, all the cell terminals should be connected to a battery management system (BMS) in a given order for accurate voltage measure. However, it would raise the special requirement for the BMS assembly, which may increase the cost and bring the inconvenience to the customs.

Accordingly, there exists a need to provide an improved method and system for calibrating the voltage of the battery pack, which reduces voltage translation error and simplifies calibration process.

SUMMARY

The present disclosure describes methods, systems, and programming for calibrating battery pack voltage. The battery pack has a plurality of cells connected in series.

In one example, a method for calibrating battery pack voltage is provided. A negative terminal voltage of one of the plurality of cells is changed from a first negative terminal voltage to a second negative terminal voltage so that an output voltage indicative of cell voltage is changed from a first output voltage to a second output voltage. A positive terminal voltage of the cell is maintained at a substantially constant level. A differential-mode calibration parameter is calculated based on a voltage difference between the first output voltage and the second output voltage and a voltage difference between the first negative terminal voltage and the second negative terminal voltage. The negative terminal voltage of the cell is then changed from the first negative terminal voltage to the second negative terminal voltage so that the positive terminal voltage of the cell is changed from a first positive terminal voltage to a second positive terminal voltage and the output voltage indicative of the cell voltage is changed from a third output voltage to a fourth output voltage. The cell voltage is maintained at a substantially constant value. A common-mode calibration parameter is calculated based on the differential-mode calibration parameter and a voltage difference between the third output voltage and the fourth output voltage and a voltage difference between the first positive terminal voltage and the second positive terminal voltage. The differential-mode calibration parameter and common-mode calibration parameter are used to calibrate the cell voltage.

In another example, a system for calibrating battery pack voltage is provided. The system includes a plurality of voltage translator circuitries corresponding to the plurality of cells and a micro controller unit. Each voltage translator circuitry is configured to detect a voltage of each corresponding cell and translate a floating voltage level of the cell to a ground referenced voltage level. Each voltage translator circuitry is further configured to calculate a common-mode calibration parameter and a differential-mode calibration parameter. The micro controller unit is coupled to the plurality of voltage translator circuitries and is configured to receive the ground referenced voltage levels of the plurality of cells and calibrate cell voltages of the plurality of cells in sequence based on the corresponding common-mode calibration parameter and differential-mode calibration parameter.

In yet another example, a machine readable and non-transitory medium having information recorded thereon for calibrating battery pack voltage, wherein the information, when read by the machine, causes the machine to perform the following. A negative terminal voltage of one of the plurality of cells is changed from a first negative terminal voltage to a second negative terminal voltage so that an output voltage indicative of cell voltage is changed from a first output voltage to a second output voltage. A positive terminal voltage of the cell is maintained at a substantially constant level. A differential-mode calibration parameter is calculated based on a voltage difference between the first output voltage and the second output voltage and a voltage difference between the first negative terminal voltage and the second negative terminal voltage. The negative terminal voltage of the cell is then changed from the first negative terminal voltage to the second negative terminal voltage so that the positive terminal voltage of the cell is changed from a first positive terminal voltage to a second positive terminal voltage and the output voltage indicative of the cell voltage is changed from a third output voltage to a fourth output voltage. The cell voltage is maintained at a substantially constant value. A common-mode calibration parameter is calculated based on the differential-mode calibration parameter and a voltage difference between the third output voltage and the fourth output voltage and a voltage difference between the first positive terminal voltage and the second positive terminal voltage. The differential-mode calibration parameter and common-mode calibration parameter are used to calibrate the cell voltage.

BRIEF DESCRIPTION OF THE DRAWINGS

The embodiments will be more readily understood in view of the following description when accompanied by the below figures and wherein like reference numerals represent like elements, wherein.

DETAILED DESCRIPTION

Reference will now be made in detail to the embodiments of the present disclosure, examples of which are illustrated in the accompanying drawings. While the present disclosure will be described in conjunction with the embodiments, it will be understood that they are not intended to limit the present disclosure to these embodiments. On the contrary, the present disclosure is intended to cover alternatives, modifications, and equivalents, which may be included within the spirit and scope of the present disclosure as defined by the appended claims.

Furthermore, in the following detailed description of embodiments of the present disclosure, numerous specific details are set forth in order to provide a thorough understanding of the present disclosure. However, it will be recognized by one of ordinary skill in the art that the present disclosure may be practiced without these specific details. In other instances, well-known methods, procedures, components, and circuits have not been described in detail as not to unnecessarily obscure aspects of the embodiments of the present disclosure.

Compared to other conventional approaches that calibrate the cell voltage based on a differential-mode calibration parameter and a perfect resistor matching, embodiments in accordance with the present disclosure provide a method and system for calculating a common-mode calibration parameter and a differential-mode calibration parameter through a two-point calibration process. Moreover, the cell voltage is calibrated in view of the common-mode calibration parameter and the differential-mode calibration parameter. In such manner, voltage translation error can be reduced and calibration process can be simplified without requiring the precise resistor matching. Furthermore, since the cell voltage is also calibrated based on the common-mode calibration parameter, which is not sensitive to the common-mode voltage, the battery cells can be randomly connected in their positions to a battery management system (BMS).

Additional advantages and novel features will be set forth in part in the description which follows, and in part will become apparent to those skilled in the art upon examination of the following and the accompanying drawings or may be learned by production or operation of the examples.

Figure 1:
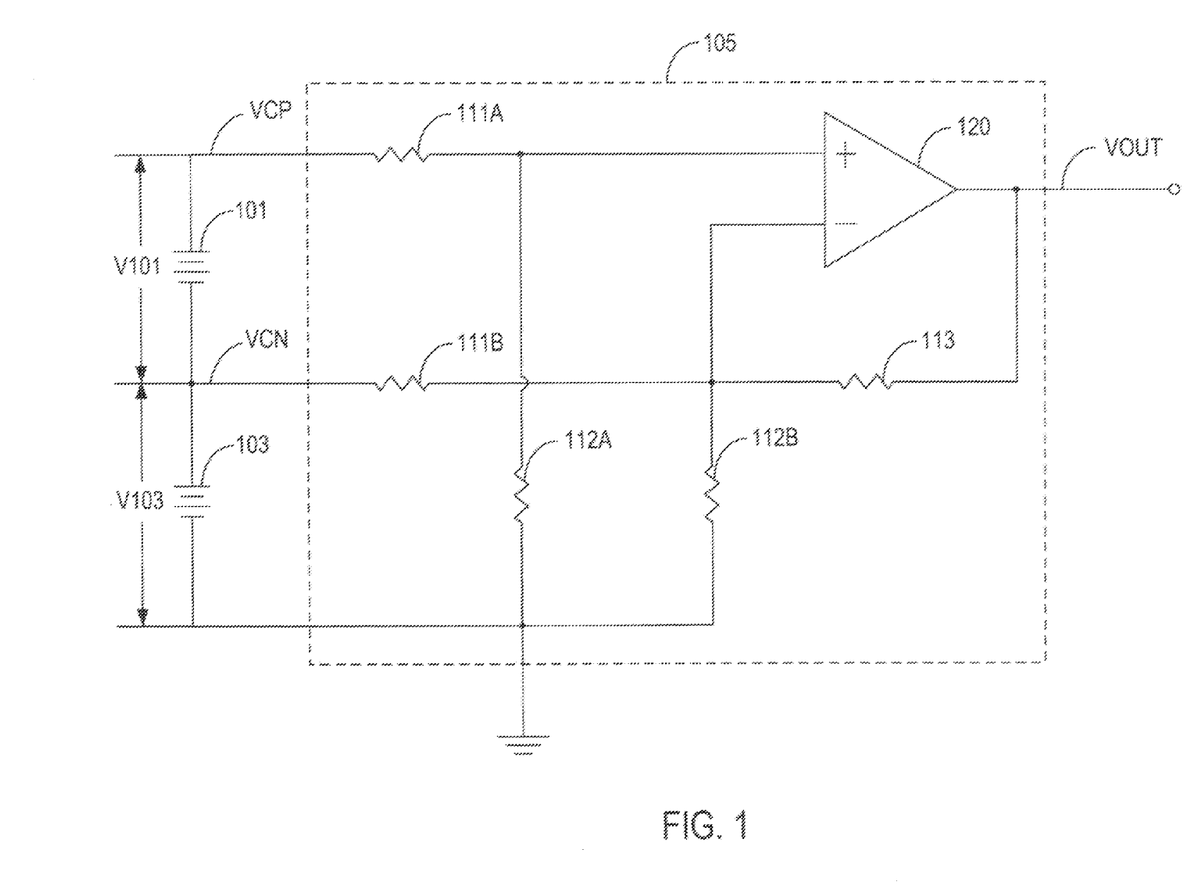
FIG. 1 is a circuit diagram illustrating an example of a voltage translator circuitry, in accordance with one embodiment of the present disclosure.

FIG. 1 is a circuit diagram illustrating an example of a voltage translator circuitry 105, in accordance with one embodiment of the present disclosure. In the example of FIG. 1, the voltage translator circuitry 105 includes an operational amplifier 120 and five resistors 111A, 111B, 112A, 112B, and 113. The voltage translator circuitry 105 in this example is configured to detect the cell voltage of a cell 101 (labeled as V101) and translate the detected floating voltage level V101 to a ground referenced voltage level VOUT. It is understood that a battery pack may include a plurality of cells connected in series. For simplicity, in this example a cell 103 is assumed to be equivalent to all other cells coupled between the cell 101 and ground. The cell voltage of the cell 103 is labeled as V103. A positive terminal voltage of the cell 101 (VCP) is provided to a positive supply terminal of the operational amplifier 120, and a negative terminal voltage of the cell 101 (VCN) is provided to a negative supply terminal of the operational amplifier 120. The ground referenced voltage level VOUT may be expressed as follows:

$$VOUT = \frac{R113}{R111B}\left[\frac{R112A}{R111A+R112A}\left(1+\frac{R111B}{R112B}+\frac{R111B}{R113}\right)VCP - VCN\right] \quad (1)$$

where R111A, R111B, R112A, R112B, and R113 are respectively the resistance values of the resistors 111A, 111B, 112A, 112B, and 113. For simplicity, $$\frac{R113}{R111B}$$

can be expressed as $\alpha$ (also referred to as a differential-mode calibration parameter) and $$\frac{R112A}{R111A+R112A}\left(1+\frac{R111B}{R112B}+\frac{R111B}{R113}\right)$$

can be expressed as $\beta$. In other words, equation (1) can be rewritten as follows:

$$VOUT = \alpha[\beta \times VCP - VCN] \quad (2)$$

It is noted that if $\beta=1$, equation (2) can be simplified to the following equation (3). Based on equation (3), the voltage V101 (i.e., VCP−VCN) can be derived by dividing the voltage VOUT by the differential-mode calibration parameter $\alpha$. However, as mentioned above, it is difficult to achieve a perfect resistor matching especially for the resistor ratios $$\frac{R112A}{R111A+R112A}, \frac{R111B}{R112B}, \text{ and } \frac{R111B}{R113}.$$

In other words, it is difficult to satisfy the condition S=1 and then the voltage V101 (i.e., VCP−VCN) needs to be calibrated so as to obtain the accurate cell voltage.

$$VOUT = \alpha(VCP-VCN) \quad (3)$$

Referring to equation (2) again, assume that $\beta$ has a composite resistor matching error dm (also referred to as a common-mode calibration parameter), i.e., $\beta=1+dm$, then equation (2) can be rewritten to the following equation (4). Since the resistance values of R111A, R111B, R112A, R112B, and R113 may have errors, the calculated $\alpha$ and dm through a two-point calibration process can be more accurate than those based on the resistor ratios.

$$VOUT = \alpha[(VCP-VCN)+dm \times VCP] \quad (4)$$

According to equation (4), the cell voltage V101 (i.e., VCP−VCN) can be calibrated based on the voltage VOUT, the common-mode calibration parameter dm, and the differential-mode calibration parameter α. Below are the specific calculation methods for the common-mode calibration parameter dm and the differential-mode calibration parameter α:

Based on equation (4) and FIG. 1, VCP is maintained at a substantially constant level first, while VCN is changed from VCN1 to VCN2, so that VOUT is changed from VOUT1a to VOUT2a. For example, VCP may be maintained at 24V and while VCN is changed from VCN1=15V to VCN2=9V. In such way, the voltage V101 is changed from 9V to 15V and VOUT is changed from VOUT1a to VOUT2a. During the parameter calculation process, VCP and VCN may be programmed to any suitable value. In such manner, the differential-mode calibration parameter α may be expressed as follows:

$$\alpha = \frac{VOUT2a - VOUT1a}{VCN1 - VCN2} \quad (5)$$

Similarly, VCP−VCN may be maintained at a substantially constant level while VCN is changed from VCN1 to VCN2 so that VCP changes from VCP1 to VCP2. Accordingly, VOUT is changed from VOUT1b to VOUT2b. For example, VCP−VCN may be maintained at 12V and while VCN is changed from VCN1=15V to VCN2=9V. In such way, the voltage VCP is changed from 27V to 21V, and VOUT is changed from VOUT1b to VOUT2b. In such manner, the common-mode calibration parameter dm may be expressed as follows:

$$dm = \frac{1}{\alpha} \frac{VOUT2b - VOUT1b}{VCP2 - VCP1} \quad (6)$$

In addition to equations (5) and (6), those skilled in the art may understand any other suitable embodiments of calculating the common-mode calibration parameter dm and the differential-mode calibration parameter α. The parameters dm and α can be calculated in advance (for example, during the PCB board-level test stage) and stored in a memory unit for the following calibration operation. For a voltage detection apparatus having a plurality of cells and a plurality of voltage translator circuitries, each voltage translator circuitry may calculate its own common-mode calibration parameter dm and the differential-mode calibration parameter α. That is, the above two-point calibration process may be repeated so as to obtain a plurality of parameters dm and α.

Figure 2:
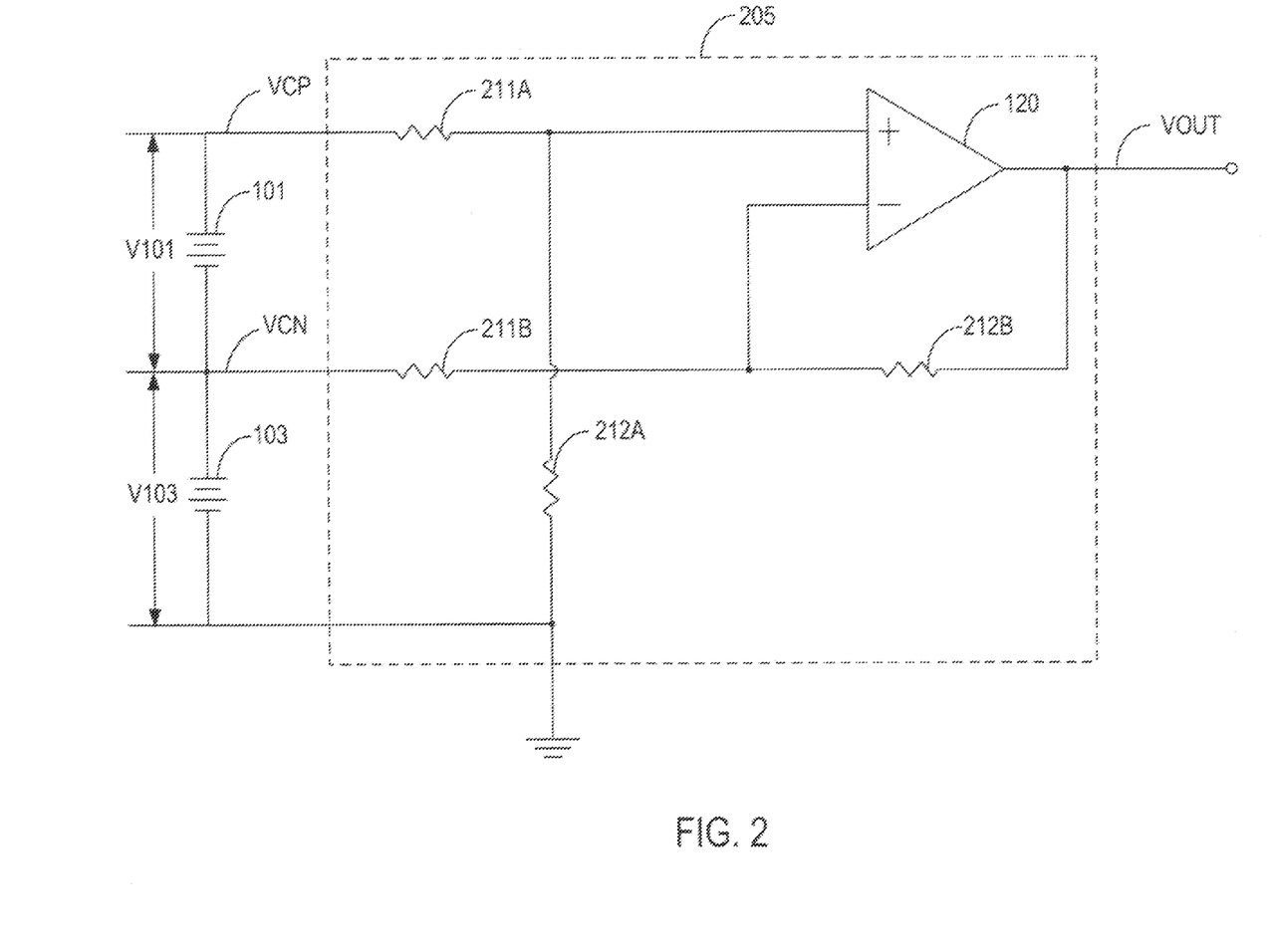
FIG. 2 is a circuit diagram illustrating another example of a voltage translator circuitry, in accordance with one embodiment of the present disclosure.

FIG. 2 is a circuit diagram illustrating another example of a voltage translator circuitry 205, in accordance with one embodiment of the present disclosure. FIG. 2 is described in combination with FIG. 1 and elements labeled the same as in FIG. 1 have similar functions. The circuit diagram of the voltage translator circuitry 205 in FIG. 2 is similar to the circuit diagram of the voltage translator circuitry 105 in FIG. 1 except for the configuration of the externally coupled resistors. In addition to the voltage translator circuitries of FIG. 1 and FIG. 2, those skilled in the art may understand any other suitable embodiments of translating the floating cell voltage level to a ground referenced voltage level consistent with the present disclosure.

In the example of FIG. 2, the voltage translator circuitry 205 includes an operational amplifier 120 and four resistors 211A, 211B, 212A, and 212B. The ground referenced voltage level VOUT may be calculated similarly to FIG. 1:

$$VOUT = \frac{R212B}{R211B}\left[\frac{R212A}{R212B}\left(\frac{R211B + R212B}{R211A + R212A}\right)VCP - VCN\right] \quad (7)$$

where R211A, R211B, R212A, and R212B represent the resistance values of the resistors 211A, 211B, 212A, and 212B respectively. For simplicity, $$\frac{R212B}{R211B}$$

can be expressed as α' (also referred to as a differential-mode calibration parameter) and $$\frac{R212A}{R212B}\left(\frac{R211B + R212B}{R211A + R212A}\right)$$

can be expressed as β'. In other words, equation (1) can be rewritten as follows:

$$VOUT = \alpha'[\beta' \times VCP - VCN] \quad (8)$$

If β'=1, equation (8) can be simplified to the following equation (9). Based on equation (9), the voltage V101 (i.e., VCP−VCN) can be derived by dividing the voltage VOUT by the differential-mode calibration parameter α'. However, as mentioned above, it is difficult to achieve a perfect resistor matching, especially for the resistor ratios $$\frac{R212A}{R212B} \text{ and } \frac{R211B + R212B}{R211A + R212A}.$$

In other words, it is difficult to satisfy the condition β'=1, and thus, the voltage V101 (i.e., VCP−VCN) needs to be calibrated so as to obtain the accurate cell voltage.

$$VOUT = \alpha'(VCP - VCN) \quad (9)$$

Referring to equation (8) again, assume that β' has a composite resistor matching error dm' (also referred to as a common-mode calibration parameter), i.e., β'=1+dm', then equation (8) can be rewritten to the following equation (10). Since the resistance values of R211A, R211B, R212A, and R212B may have errors, the calculated α' and dm' through a two-point calibration process can be more accurate than those based on the resistor ratios.

$$VOUT = \alpha'[(VCP - VCN) + dm' \times VCP] \quad (10)$$

According to equation (10), the cell voltage V101 (i.e., VCP−VCN) can be calibrated based on the voltage VOUT, the common-mode calibration parameter dm', and the differential-mode calibration parameter α'. Below are examples of calculation methods for the common-mode calibration parameter dm' and the differential-mode calibration parameter α'.

Based on equations (10) and FIG. 2, VCP is maintained at a substantially constant level while VCN is changed from VCN3 to VCN4 so that VOUT is changed from VOUT3a to VOUT4a. In such manner, the differential-mode calibration parameter α' may be expressed as follows:

$$\alpha' = \frac{VOUT4a - VOUT3a}{VCN3 - VCN4} \quad (11)$$

Similarly, VCP−VCN is maintained at a substantially constant level while VCN is changed from VCN3 to VCN4 so that VCP changes from VCP3 to VCP4. Accordingly, VOUT is changed from VOUT3b to VOUT4b. In such manner, the common-mode calibration parameter dm' may be expressed as follows:

$$dm' = \frac{1}{\alpha'} \frac{VOUT4b - VOUT3b}{VCP4 - VCP3} \quad (12)$$

In addition to equations (11) and (12), those skilled in the art may understand any other suitable embodiments of calculating the common-mode calibration parameter dm' and the differential-mode calibration parameter α'. The parameters dm' and a can be calculated in advance (for example, during the PCB board-level test stage) and stored in a memory unit for the following calibration operation. For a voltage detection apparatus having a plurality of cells and a plurality of voltage translator circuitries, each voltage translator circuitry has its own common-mode calibration parameter dm and the differential-mode calibration parameter α. That is, the above mentioned two-point calibration process may be repeated so as to obtain a plurality of parameters dm' and α'.

Figure 3:
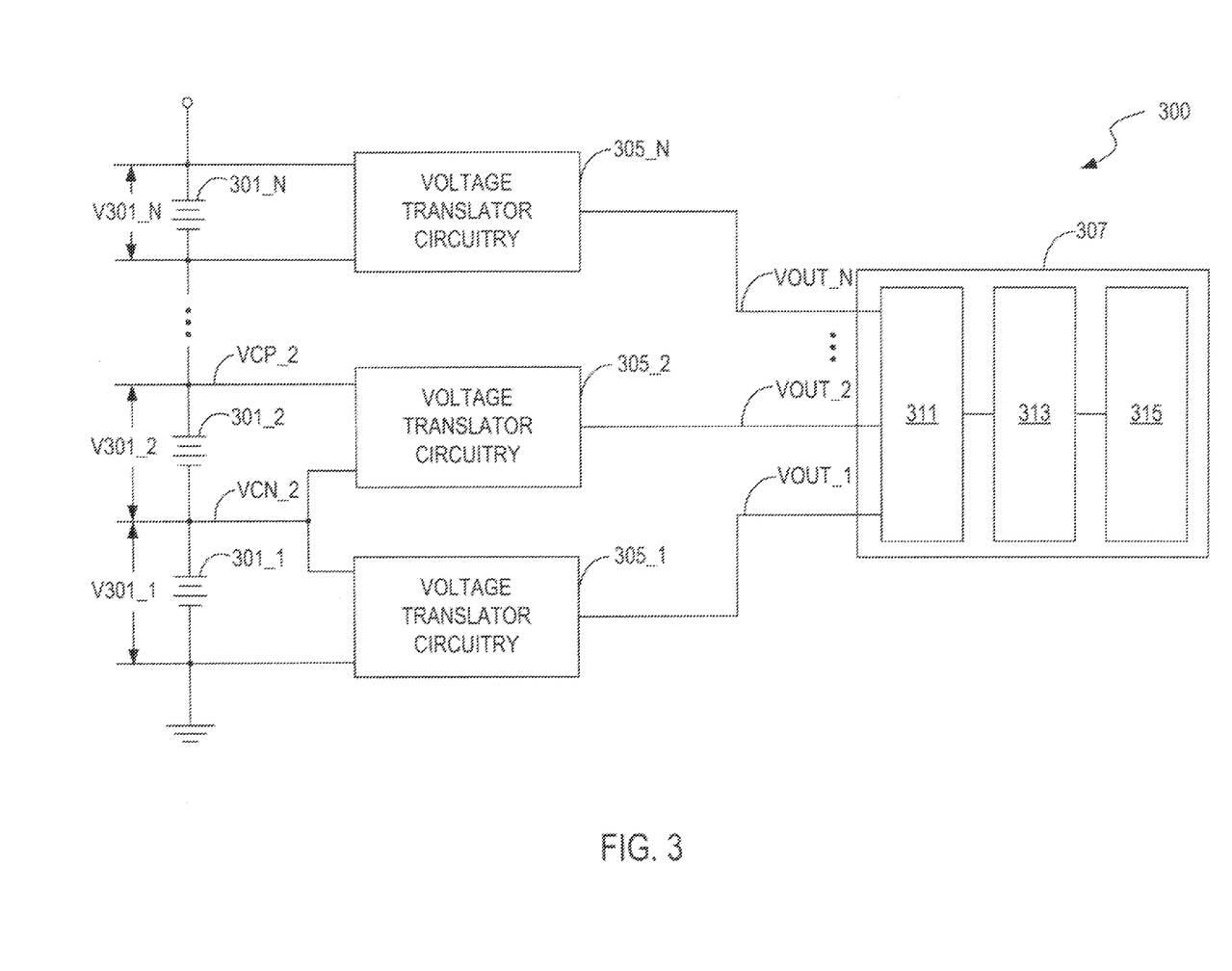
FIG. 3 is a block diagram illustrating an example of a voltage detection apparatus having the voltage translator circuitry shown in FIG. 1 or FIG. 2, in accordance with one embodiment of the present disclosure.

FIG. 3 is a block diagram illustrating an example of a voltage detection apparatus 300 having the voltage translator circuitry shown in FIG. 1 or FIG. 2, in accordance with one embodiment of the present disclosure. FIG. 3 is described in combination with FIG. 1 and FIG. 2. The voltage detection apparatus 300 includes a plurality of cells (for example, 301_1 to 301_N) connected in series, a plurality of corresponding voltage translator circuitries (for example, 305_1 to 305_N), and a micro controller unit (MCU) 307. The voltage detection apparatus 300 detects the cell voltages of cells 301_1 to 301_N (labeled as V301_1 to V301_N). Referring to the cell connection in FIG. 3, by way of example and not limitation, the cell 301_1 has a lowest voltage potential, while the cell 301_N has a highest voltage potential.

Each of the cells 301_1 to 301_N is coupled to a corresponding voltage translator circuitry (305_1 to 305_N). As shown in FIG. 3, the cell 301_1 is coupled to a voltage translator circuitry 305_1, the cell 301_2 is coupled to a voltage translator circuitry 305_2, and the cell 301_N is coupled to a voltage translator circuitry 305_N. The j-th voltage translator circuitry (305j) detects the voltage of a corresponding cell (301_j) and translates the detected floating voltage level V301j to a ground referenced voltage level VOUTj, where j is an integer from 1 to N. Each voltage translator circuitry may have a similar circuitry and electrical feature, and can be implemented using the voltage translator circuitry 105 or 205.

In this example, the MCU 307 includes a multiplexer (MUX) 311, an A/D converter (ADC) 313, and a computing unit 315. The MUX 311 is coupled to the voltage translator circuitries 305_1 to 305_N for selecting a ground referenced voltage level (for example, VOUT_j). The ADC 313 converts the voltage VOUT_j from a analog signal to a digital signal and provides the digital value to the computing unit 315.

In one embodiment, the MUX 311 selects the ground referenced voltage level in sequence, for example, from VOUT_1 to VOUT_N. As already mentioned with regard to FIG. 1 and FIG. 2, before calibration process, the common-mode calibration parameter dm and the differential-mode calibration parameter α may be calculated in advance (for example, during the PCB board-level test stage) and stored in the computing unit 315. For the voltage translator circuitries 305_1 to 305_N corresponding to the cells 301_1 to 301_N, each has its own common-mode calibration parameter dm_1 to dm_N and the differential-mode calibration parameter α_1 to α_N. In this example, or the bottom cell 301_1, the common-mode calibration parameter dm_1 may be set to zero. Below is an example of calibration process of calibrating V301_1 to V301_N by utilizing VOUT_1 to VOUT_N, the calculated common-mode calibration parameters dm_1l to dm_N, and the differential-mode calibration parameters α_1 to α_N.

First, the MUX 311 selects the ground referenced voltage level VOUT_1.

For example, based on equation (3) and FIG. 3, the cell voltage V301_1 can be calibrated by the computing unit 315 as follows:

$$VOUT\_1 = \alpha\_1[(VCN\_2 - 0) + dm\_1 \times VCN\_2] = \alpha\_1 \times VCN\_2 \quad (13)$$

$$V301\_1 = VCN\_2 = \frac{VOUT\_1}{\alpha\_1} \quad (14)$$

where VCN_2 is defined as the negative terminal voltage of the cell 301_2, which is also the positive terminal voltage of the cell 301_1.

Then, the MUX 311 selects the ground referenced voltage level VOUT_2. For example, based on equation (3) and FIG. 3, the cell voltage V301_2 can be calibrated by the computing unit 315 as follows:

$$VOUT\_2 = \alpha\_2[(VCP\_2 - VCN\_2) + dm\_2 \times (V301\_1 + V301\_2)] \quad (15)$$
$$= \alpha\_2[V301\_2 + dm\_2 \times (V301\_1 + V301\_2)]$$

$$V301\_2 = \left[\frac{VOUT\_2}{\alpha\_2} - dm\_2 \times V301\_1\right] \Big/ (1 + dm\_2) \quad (16)$$

Since the calibration principles of the others cells are the same as that of the cell 301_2, further description thereof is omitted for simplicity. Furthermore, in addition to the above-mentioned calibration process, those skilled in the art may understand any other suitable embodiments of calibrating the cell voltage based on calibration parameters consistent with the present disclosure.

In operation, since a real value measured by a meter may be slightly different from a theoretical value, equation (4) may be rewritten as follows:

$$VOUT = \alpha[(VCP - VCN) + dm \times VCP] + VOS \quad (17)$$

where VOS is the final offset between the real value and the theoretical value of VOUT. Based on the given and programmable VCP and VCN, the theoretical value α[(VCP−VCN) |dm×VCP] may be calculated first and then, the real value of VOUT may be measured by using any suitable meter so as to obtain the final offset VOS. More specifically, VCN is maintained a substantially constant level while VCP is changed from VCP1 to VCP2 so that VOUT is changed from VOUT1a to VOUT2a, and VOS1 and VOS2 is obtained. VOS may be an average value of VOS1 and VOS2.

Similarly to the common-mode calibration parameter dm and the differential-mode calibration parameter α, for the voltage translator circuitries 305_1 to 305_N corresponding to the cells 301_1 to 301_N, each has its own final offset (VOS_1 to VOS_N). The final offsets VOS_1 to VOS_N may be calculated in advance (for example, during the PCB board-level test stage) and stored in a memory unit for the following calibration operation. The specific calibration process by utilizing the calculated final offsets, the common-mode calibration parameters and the differential-mode calibration parameters is similar to equations (11) to (14), further description thereof is omitted for simplicity.

Based on the calculated common-mode calibration parameter dm and the differential-mode calibration parameter α, the voltage of each cell can be accurately calibrated in sequence, for example, from V301_1 to V301_N. In such way, the detected cell voltage is not sensitive to the common-mode voltage, therefore the battery cells can be randomly connected in their position to BMS.

Figure 4:
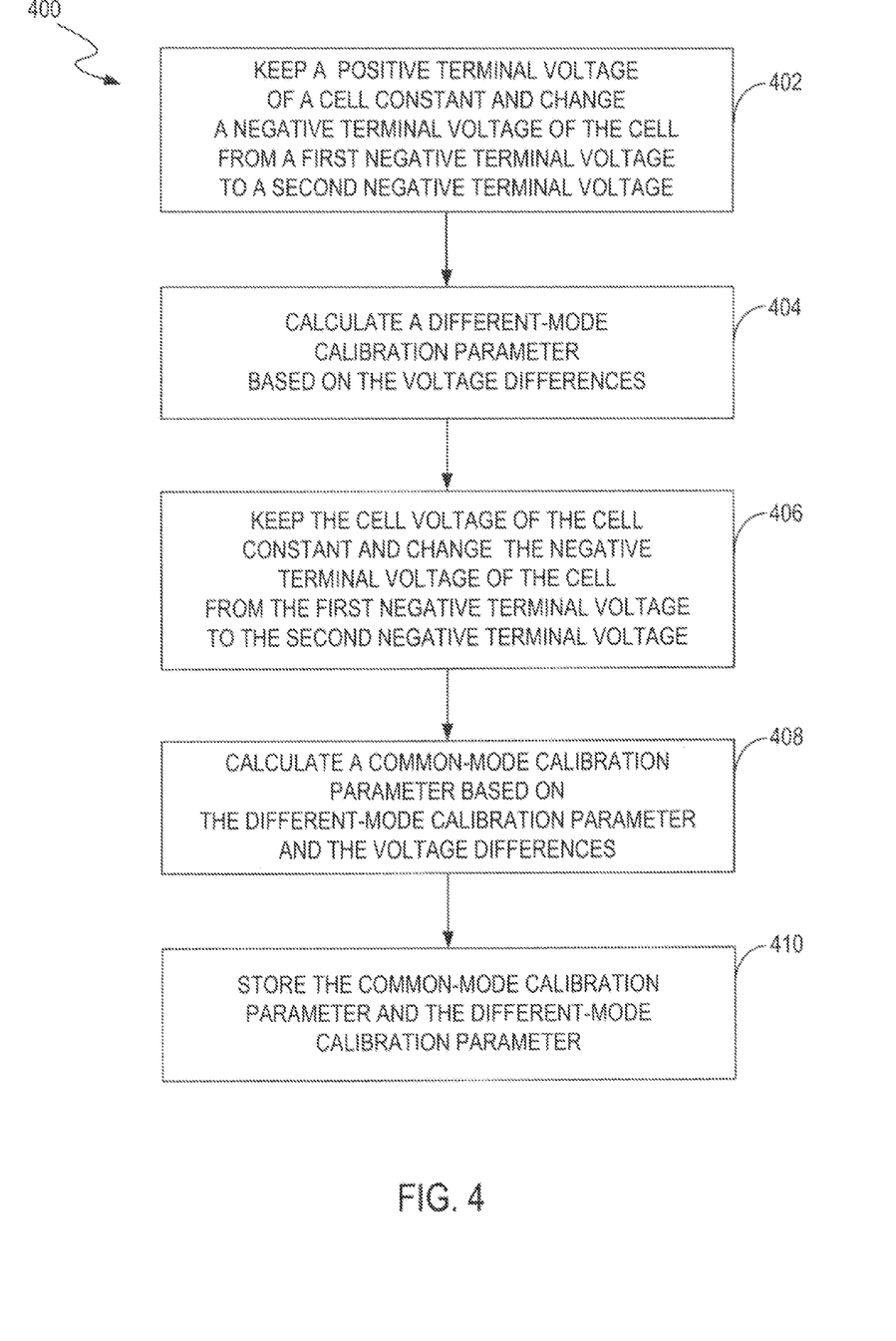
FIG. 4 is a flow chart illustrating an example of method for calculating calibration parameters through a two-point calibration process, in accordance with one embodiment of the present disclosure.

FIG. 4 is a flow chart illustrating an example of a method 400 for calculating calibration parameters through a two-point calibration process, in accordance with one embodiment of the present disclosure. It will be described with reference to the above figures. However, any suitable module or unit may be employed.

In operation, beginning at block 402, a positive terminal voltage of a cell, e.g., the cell 101, is kept at a substantially constant level and a negative terminal voltage of the cell 101, is changed from a first negative terminal voltage to a second negative terminal voltage. The positive terminal voltage of the cell is provided to a positive supply terminal of an operational amplifier, e.g., the operational amplifier 120, and the negative terminal voltage of the cell is provided to a negative supply terminal of the operational amplifier. As described above, during the parameter calculation process, the terminal voltages of the cell can be programmed to any suitable value. Due to the change of the terminal voltage of the cell 101, an output voltage indicative of the cell voltage is changed from a first output voltage to a second output voltage. At block 404, a differential-mode calibration parameter is calculated based on the voltage difference of the output voltage and the voltage difference of the negative terminal voltage. As described above, the differential-mode calibration parameter may be equal to the voltage difference between the second output voltage and the first output voltage divided by the voltage difference between the first negative terminal voltage and the second negative terminal voltage, e.g., equation (4). Proceeding to block 406, the cell voltage of the cell 101 is kept at a substantially constant level and the negative terminal voltage of the cell 101 is changed from the first negative terminal voltage to the second negative terminal voltage. The positive terminal voltage of the cell 101 is changed from a first positive terminal voltage to a second positive terminal voltage. Due to the change of the terminal voltages of the cell 101, the output voltage indicative of the cell voltage is changed from a third output voltage to a fourth output voltage. At block 408, a common-mode calibration parameter is calculated based on the differential-mode calibration parameter, the voltage difference of the output voltage, and the voltage difference of the positive terminal voltage. As described above, the common-mode calibration parameter is equal to the difference between the fourth output voltage and the third output voltage divided by the product of the differential-mode calibration parameter and the difference between the second positive terminal voltage and the first positive terminal voltage, e.g., equation (5). Finally, at block 410, the common-mode calibration parameter and the differential-mode calibration parameter are stored in a memory unit for the following calibration operation. In some cases, a final offset of the output voltage can be calculated based on the difference between a real value and a theoretical value of the output voltage. The final offset is also stored in the memory unit for the following calibration operation.

For a voltage detection apparatus having a plurality of voltage translator circuitries corresponding to a plurality of cells, each voltage translator circuitry calculates its own common-mode calibration parameter, differential-mode calibration parameter, and final offset of the output voltage. In other words, the method 400 for calculating the calibration parameters through the two-point calibration process may be repeated until calibration parameters of all the cells are obtained.

Figure 5:
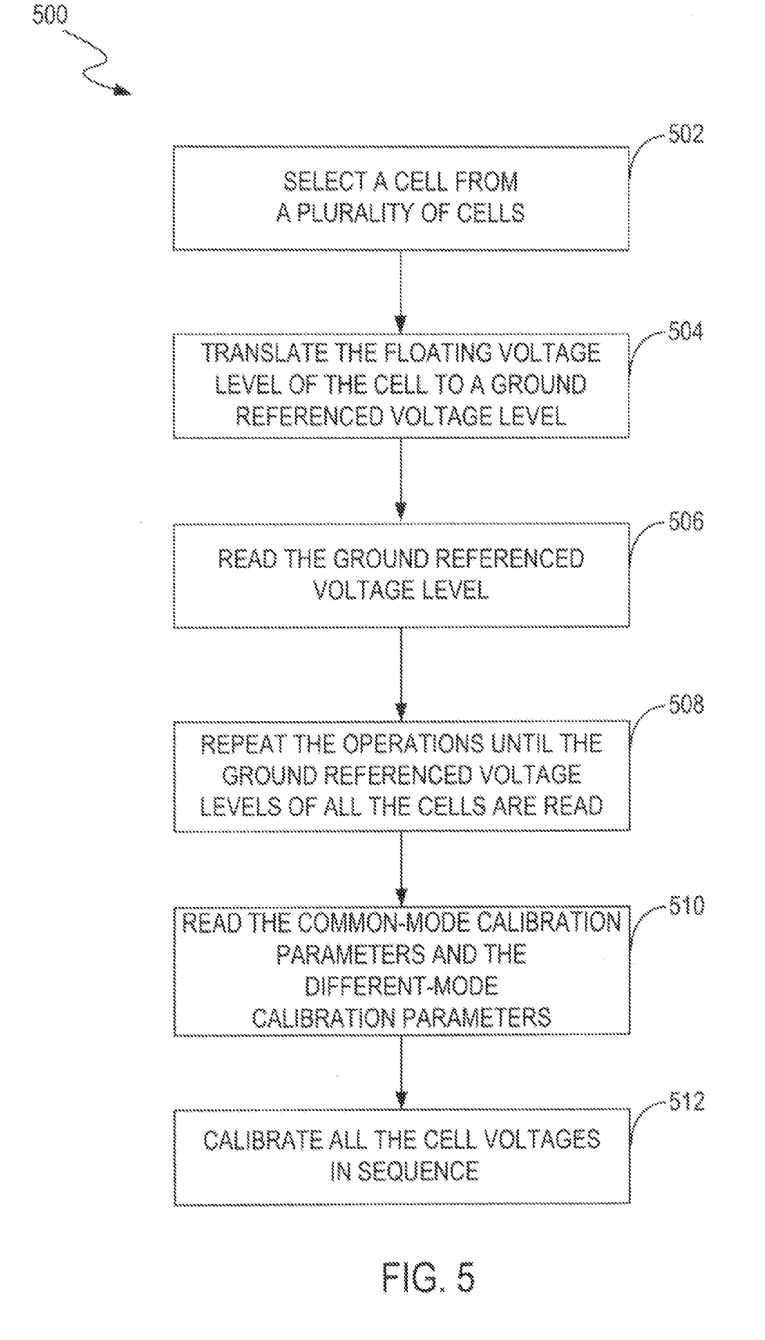
FIG. 5 is a flow chart illustrating an example of method for calibrating the voltage of a battery pack, in accordance with one embodiment of the present disclosure.

FIG. 5 is a flow chart illustrating an example of method 500 for calibrating the voltage of a battery pack, in accordance with one embodiment of the present disclosure. It will be described hereinafter how the voltage detection apparatus 300 calibrates the cell voltage of the cells 301_1 to 301_N. However, any suitable module or unit may be employed. FIG. 5 is described in combination with FIG. 3 and FIG. 4.

In operation, beginning at block 502, a cell is selected from a plurality of cells and the voltage of the cell will be calibrated in the following steps. The selected cell is cell 301_j in this example for the purpose of description, where j is an integer from 1 to N. At block 504, the floating voltage level of the cell 301_j is translated to a ground referenced voltage level VOUT_j. At block 506, the ground referenced voltage level VOUTj is read, e.g., by the MCU 307 of the voltage detection apparatus 300. At block 508, the operations of block 502 to 506 are repeated until the ground referenced voltage levels of all the cells are read by the MCU 307. For example, VOUT_1 to VOUT_N are read in sequence. Proceeding to block 510, the stored common-mode calibration parameters and the differential-mode calibration parameters are read to calibrate all the cell voltages. In some cases, the stored final offsets of the output voltages can also be read to calibrate all the cell voltages. At block 512, all the cell voltages are calibrated in sequence. As described above, the cell voltage V301_2 can be calibrated by the cell voltage V301_1, the corresponding common-mode calibration parameter, and the corresponding differential-mode calibration parameter. Similarly, the cell voltage V301_j can be calibrated by the calibrated cell voltages V301_1 to V301_(j−1), the corresponding common-mode calibration parameter, and the corresponding differential-mode calibration parameter.

Once the common-mode calibration parameter and the differential-mode calibration parameter are obtained through the two-point calibration process, the voltage of each cell can be accurately calibrated in sequence. In such manner, voltage translation error can be reduced and calibration process can be simplified without requiring the precise resistor matching.

Aspects of the method for calibrating the voltage of the battery pack, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the programming.

All or portions of the computer-implemented method may at times be communicated through a network such as the Internet or various other telecommunication networks. Such communications, for example, may enable loading of the computer-implemented method from one computer or processor into another. Thus, another type of media that may bear the elements of the computer-implemented method includes optical, electrical, and electromagnetic waves, such as used across physical interfaces between local devices, through wired and optical landline networks and over various airlinks. The physical elements that carry such waves, such as wired or wireless links, optical links or the like, also may be considered as media bearing the computer-implemented method. As used herein, unless restricted to tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings.

Volatile storage media include dynamic memory, such as a main memory of such a computer platform. Tangible transmission media include coaxial cables; copper wire and fiber optics, including the wires that form a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Those skilled in the art will recognize that the present disclosure is amenable to a variety of modifications and/or enhancements. For example, although the implementation of various components described above may be embodied in a hardware device, it can also be implemented as a software solution, e.g., an installation on an existing server. In addition, the "module," "unit," or "logic" as disclosed herein can be implemented as a firmware, firmware/software combination, firmware/hardware combination, or a hardware/firmware/software combination.

While the foregoing description and drawings represent embodiments of the present disclosure, it will be understood that various additions, modifications, and substitutions may be made therein without departing from the spirit and scope of the principles of the present disclosure as defined in the accompanying claims. One skilled in the art will appreciate that the present disclosure may be used with many modifications of form, structure, arrangement, proportions, materials, elements, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the present disclosure being indicated by the appended claims and their legal equivalents, and not limited to the foregoing description.

I claim:

1. A method for calibrating battery pack voltage, the battery pack having a plurality of cells connected in series, the method comprising:
    changing a negative terminal voltage of one of the plurality of cells from a first negative terminal voltage to a second negative terminal voltage so that an output voltage indicative of cell voltage is changed from a first output voltage to a second output voltage,
    wherein a positive terminal voltage of the cell is substantially constant; calculating a voltage difference between the first output voltage and the second output voltage;
    calculating a differential-mode calibration parameter that is to be used to calibrate the cell voltage, based on the voltage difference between the first output voltage and the second output voltage and a voltage difference between the first negative terminal voltage and the second negative terminal voltage,
    wherein the differential-mode calibration parameter is equal to the voltage difference between the first output voltage and the second output voltage divided by the voltage difference between the first negative terminal voltage and the second negative terminal voltage;
    changing the negative terminal voltage of the cell from the first negative terminal voltage to the second negative terminal voltage so that the positive terminal voltage of the cell is changed from a first positive terminal voltage to a second positive terminal voltage and the output voltage indicative of the cell voltage is changed from a third output voltage to a fourth output voltage, wherein the cell voltage is substantially constant; and
    calculating a common-mode calibration parameter based on the differential-mode calibration parameter and a voltage difference between the third output voltage and the fourth output voltage and a voltage difference between the first positive terminal voltage and the second positive terminal voltage, wherein the differential-mode calibration parameter and common-mode calibration parameter are used to calibrate the cell voltage.

2. The method of claim 1, wherein the positive terminal voltage of the cell is provided to a positive supply terminal of an operational amplifier and the negative terminal voltage of the cell is provided to a negative supply terminal of the operational amplifier.

3. The method of claim 1, wherein the positive terminal voltage and the negative terminal voltage are programmable, and the common-mode calibration parameter and the differential-mode calibration parameter are calculated during a printing circuit board (PCB) board-level test stage.

4. The method of claim 1, wherein the common-mode calibration parameter is equal to the voltage difference between the third output voltage and the fourth output voltage divided by the product of the differential-mode calibration parameter and the voltage difference between the first positive terminal voltage and the second positive terminal voltage.

5. The method of claim 1, further comprising:
    repeating the calculating operations so as to obtain common-mode calibration parameters and differential-mode calibration parameters of the plurality of cells; and
    storing the common-mode calibration parameters and the differential-mode calibration parameters of the plurality of cells.

6. The method of claim 5, further comprising:
    selecting a cell from the plurality of cells;
    translating a floating voltage level of the cell to a ground referenced voltage level;
    reading the ground referenced voltage level of the cell;

repeating the selecting, translating, and reading operations until the ground referenced voltage levels of the plurality of cells are read;

reading the common-mode calibration parameters and the differential-mode calibration parameters; and calibrating cell voltages of the plurality of cells in sequence based on the corresponding common-mode calibration parameter and differential-mode calibration parameter.

7. The method of claim 6, wherein a first cell has a lowest voltage potential of the plurality of cells and a second cell has a highest voltage potential of the plurality of cells, and the step of calibrating cell voltages comprises the step of calibrating cell voltages of the plurality of cells from the first cell to the second cell.

8. The method of claim 1, further comprising:

calculating a final offset of the output voltage based on a difference between a real value measured by a meter and a theoretical value;

repeating the calculating operation until final offsets of the plurality of cells are obtained; and storing the final offsets.

9. A system for calibrating battery pack voltage, the battery pack having a plurality of cells connected in series, the system comprising:

a plurality of voltage translator circuitries corresponding to the plurality of cells, each voltage translator circuitry configured to:

detect a voltage of each corresponding cell and translate a floating voltage level of the cell to a ground referenced voltage level, and calculate a common-mode calibration parameter and a differential-mode calibration parameter, wherein during the differential-mode calibration parameter calculation of each voltage translator circuitry, a positive terminal voltage of the corresponding cell is substantially constant and a negative terminal voltage of the corresponding cell is changed from a first negative terminal voltage to a second negative terminal voltage so that an output voltage indicative of cell voltage is changed from a first output voltage to a second output voltage, wherein a voltage difference between the first output voltage and the second output voltage is calculated for the differential-mode calibration parameter that is used to calibrate the cell voltage, and wherein the differential-mode calibration parameter is equal to the voltage difference between the first output voltage and the second output voltage divided by the voltage difference between the first negative terminal voltage and the second negative terminal voltage;

a micro controller unit coupled to the plurality of voltage translator circuitries and configured to:

receive the ground referenced voltage levels of all the cells; and calibrate cell voltages of the plurality of cells in sequence based on the corresponding common-mode calibration parameter and differential-mode calibration parameter.

10. The system of claim 9, wherein the plurality of common-mode calibration parameters and the plurality of differential-mode calibration parameters are calculated during a PCB board-level test stage, and the plurality of common-mode calibration parameter and the plurality of differential-mode calibration parameter are stored in the micro controller unit.

11. The system of claim 9, wherein during the common-mode calibration parameter calculation of each voltage translator circuitry, the cell voltage of the corresponding cell is substantially constant and a negative terminal voltage of the corresponding cell is changed from a first negative terminal voltage to a second negative terminal voltage so that a positive terminal voltage of the cell is changed from a first positive terminal voltage to a second positive terminal voltage and an output voltage indicative of the cell voltage is changed from a third output voltage to a fourth output voltage, and the common-mode calibration parameter is equal to the voltage difference between the fourth output voltage and the third output voltage divided by the product of the differential-mode calibration parameter and the voltage difference between the second positive terminal voltage and the first positive terminal voltage.

12. The system of claim 9, wherein each voltage translator circuitry comprises an operational amplifier having a positive supply to receive a positive terminal voltage of the corresponding cell and a negative supply to receive a negative terminal voltage of the corresponding cell.

13. The system of claim 9, wherein the micro controller unit comprises:

a multiplexer, coupled to the plurality of voltage translator circuitries and configured to select the ground referenced voltage levels of the plurality of cells;

an analog to digital (A/D) converter, coupled to the multiplexer and configured to convert the selected ground referenced voltage level from an analog signal to a digital signal;

a computing unit, coupled to the A/D converter and configured to receive the digital ground referenced voltage level and calibrate the cell voltages of the plurality of cells in sequence based on the corresponding common-mode calibration parameter and the corresponding differential-mode calibration parameter.

14. The system of claim 13, wherein a first cell has a lowest voltage potential of the plurality of cells and a second cell has a highest voltage potential of the plurality of cells, and the computing unit calibrates the cell voltages of the plurality of cells from the first cell to the second cell.

15. A machine-readable tangible and non-transitory medium having information for calibrating battery pack voltage recorded thereon, the battery pack having a plurality of cells connected in series, wherein the information, when read by the machine, causes the machine to perform the following:

changing a negative terminal voltage of one of the plurality of cells from a first negative terminal voltage to a second negative terminal voltage so that an output voltage indicative of cell voltage is changed from a first output voltage to a second output voltage, wherein a positive terminal voltage of the cell is substantially constant;

calculating a voltage difference between the first output voltage and the second output voltage;

calculating a differential-mode calibration parameter that is to be used to calibrate the cell voltage, based on the voltage difference between the first output voltage and the second output voltage and a voltage difference between the first negative terminal voltage and the second negative terminal voltage, wherein the differential-mode calibration parameter is equal to the voltage difference between the first output voltage and the second output voltage divided by the voltage difference between the first negative terminal voltage and the second negative terminal voltage;

changing the negative terminal voltage of the cell from the first negative terminal voltage to the second negative terminal voltage so that the positive terminal voltage of the cell is changed from a first positive terminal voltage to a second positive terminal voltage and the output voltage indicative of the cell voltage is changed from a third output voltage to a fourth output voltage, wherein the cell voltage substantially constant; and calculating a common-mode calibration parameter based on the differential-mode calibration parameter and a voltage difference between the third output voltage and the fourth output voltage and a voltage difference between the first positive terminal voltage and the second positive terminal voltage, wherein the differential-mode calibration parameter and common-mode calibration parameter are used to calibrate the cell voltage.

16. The medium of claim 15, wherein the positive terminal voltage of the cell is provided to a positive supply terminal of an operational amplifier and the negative terminal voltage of the cell is provided to a negative supply terminal of the operational amplifier.

17. The medium of claim 15, wherein the positive terminal voltage and the negative terminal voltage are programmable, and the information is read during a PCB board-level test stage.

18. The medium of claim 15, wherein the common-mode calibration parameter is equal to the voltage difference between the third output voltage and the fourth output voltage divided by the product of the differential-mode calibration parameter and the voltage difference between the second positive terminal voltage and the first positive terminal voltage.

19. The medium of claim 15, wherein the information, when read by the machine, further causes the machine to repeat the calculating operations so as to obtain common-mode calibration parameters and differential-mode calibration parameters of the plurality of cells and to store the common-mode calibration parameters and the differential-mode calibration parameters of the plurality of cells.

* * * * *